United States Patent
Yi et al.

(10) Patent No.: US 9,536,987 B2
(45) Date of Patent: Jan. 3, 2017

(54) LINE-END CUTTING METHOD FOR FIN STRUCTURES OF FINFETS FORMED BY DOUBLE PATTERNING TECHNOLOGY

(71) Applicant: SHANGHAI IC R & D CENTER CO., LTD., Shanghai (CN)

(72) Inventors: Chunyan Yi, Shanghai (CN); Ming Li, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 14/764,175

(22) PCT Filed: Nov. 24, 2014

(86) PCT No.: PCT/CN2014/092014
§ 371 (c)(1),
(2) Date: Jul. 29, 2015

(87) PCT Pub. No.: WO2016/015416
PCT Pub. Date: Feb. 4, 2016

(65) Prior Publication Data
US 2016/0254369 A1    Sep. 1, 2016

(30) Foreign Application Priority Data

Jul. 31, 2014    (CN) .......................... 2014 1 0371037

(51) Int. Cl.
*H01L 29/66* (2006.01)
*H01L 21/027* (2006.01)
*H01L 21/308* (2006.01)
*H01L 21/311* (2006.01)

(52) U.S. Cl.
CPC ..... *H01L 29/66795* (2013.01); *H01L 21/0276* (2013.01); *H01L 21/3086* (2013.01); *H01L 21/31116* (2013.01); *H01L 21/31138* (2013.01)

(58) Field of Classification Search
CPC .......... H01L 29/66795; H01L 21/0276; H01L 21/02274; H01L 21/0228; H01L 21/67069; H01L 21/68785
See application file for complete search history.

(56) References Cited

U.S. PATENT DOCUMENTS 8,603,893 B1 * 12/2013 Wei .................. H01L 21/76229
257/E21.546
2009/0258318 A1 * 10/2009 Chan .................. H01L 21/0273
430/312

* cited by examiner

*Primary Examiner* — Duy Deo

(57) ABSTRACT

A line-end cutting method for fin structures of FinFETs formed by double patterning technology firstly utilizes the SiN hard mask lines to form fin structures and then performs lithography and etching processes to form line-end cuts. Since the depth of the line-end cuts is large, there is enough time and space to regulate the etching recipe so as to balance the etching rate of multiple layers including the spin-on-carbon layer, the SiN layer, the $SiO_2$ layer and the silicon substrate, thereby forming the fin structures with line-end cuts having flatter bottom topography, preventing the formation of silicon protrusions or silicon cones during the etching process and improving the device electrical performance.

12 Claims, 12 Drawing Sheets

US 9,536,987 B2

LINE-END CUTTING METHOD FOR FIN STRUCTURES OF FINFETS FORMED BY DOUBLE PATTERNING TECHNOLOGY

CROSS-REFERENCE TO RELATED APPLICATION

This application claims the priority benefit of International Patent Application Serial No. PCT/CN2014/092014, filed Nov. 24, 2014, which is related to and claims the priority benefit of China patent application serial no. 201410371037.5 filed Jul. 31, 2014. The entirety of each of the above-mentioned patent applications is hereby incorporated by reference herein and made a part of this specification.

FIELD OF THE INVENTION

The present invention relates to the field of semiconductor integrated circuit manufacturing and particularly to a line-end cutting method for fin structures of FinFETs formed by sidewall self-aligned double patterning technology.

BACKGROUND OF THE INVENTION

It is forecasted in the International Technology Roadmap for Semiconductors (ITRS) that in order to follow the "Moore's law", obtain better short-channel effect and improve the control of the current leakage from the gate electrode to the channel, new transistor structures, that is, FinFETs (Fin Field Effect Transistors) will be proposed. However, since the width of the fin of a FinFET at 22 nm node dimensions and beyond is approximately 10~15 nm, which exceeds the resolution limit of the existing immersion lithography equipment, the formation of the fin-like active region is a challenging process. Therefore, the sidewall self-aligned double patterning technology is used for the formation of fin-like active regions. The sidewall self-aligned double patterning technology involves firstly performing immersion lithography and etching processes on a wafer deposited with various mask materials so as to form a sacrificial core pattern, secondly performing an atomic layer deposition (ALD) process to deposit a layer of sidewall material on the sacrificial core pattern, and then using anisotropic dry etching to form sidewalls followed by removing the sacrificial core pattern so as to form hard mask patterns for the fins at desired half pitch, wherein the width of the hard mask is determined by the thickness of the ALD layer; after that, performing lithography and etching processes of line-end cuts for the fins and then using the hard mask patterns as a protection layer and continuing etching to form the fins of the FinFETs.

FIGS. 1A to 1O illustrate the conventional method of forming fin structures and line-end cuts using sidewall self-aligned double patterning technology.

Firstly, as shown in FIG. 1A, on a silicon substrate 101 of a semiconductor active device, a $SiO_2$ insulating layer 102, a SiN layer 103, a first amorphous carbon layer 104, a SiN etch stop layer 105, a second amorphous carbon layer 106 and a nitrogen-free anti-reflection layer 107 are deposited successively from bottom to top. Wherein, the SiN layer 103 is used as a hard mask to form the final fin structures.

Then, as shown in FIG. 1B, an organic anti-reflection layer 108 and a photoresist 109 are spin coated on the top of the layer 107 and then a lithography process is performed to define a sacrificial core pattern.

Afterwards, as shown in FIG. 1C, the photoresist 109 is used as a hard mask to dry etch the second amorphous carbon layer 106 so as to form the sacrificial core pattern in the second amorphous carbon layer 106, thus the amorphous carbon sacrificial core pattern and the nitrogen-free anti-reflection layer 107 on its top are formed. Due to the process limitation, the amorphous carbon sacrificial core pattern does not have completely vertical sidewall profile, and etching damages may occur near the top of the second amorphous carbon layer 106, which may lead to profile variations of the subsequent formed sidewall hard mask adjacent to the second amorphous carbon layer 106 and affect the definition of the subsequent pattern to be formed.

After a wet clean process, as shown in FIG. 1D, a $SiO_2$ hard mask layer 110 is formed on the amorphous carbon sacrificial core pattern and the nitrogen-free anti-reflection layer 107.

As shown is FIG. 1E, anisotropic dry etching is performed to the $SiO_2$ hard mask layer 110 and is stopped on the SiN etch stop layer so as to form $SiO_2$ sidewalls 110.

Then, as shown in FIG. 1F, the nitrogen-free anti-reflection layer 107 of the sacrificial core pattern is removed by plasma dry etching to expose the sacrificial core pattern 106.

As shown in FIG. 1G, the amorphous carbon of the sacrificial core pattern is removed by a dry stripping process.

As shown in FIG. 1H, dry etching is performed using the $SiO_2$ sidewalls 110 as a mask to remove the SiN etch stop layer 105, the first amorphous carbon layer 104 and the bottom SiN layer 103 below the $SiO_2$ sidewalls 110 and is stopped on the $SiO_2$ insulating layer 102, so as to form SiN hard mask lines 111 at half pitches.

After necessary wet clean, as shown in FIG. 1I, a line-end cutting process for the fin lines is performed which involves spin coating a spin-on-carbon layer 112, an anti-reflection layer 113 and a photoresist layer 114 on the SiN hard mask lines 111 and then performing exposure and development to form the required line-end cut pattern.

As shown in FIG. 1J, dry etching is performed using the photoresist layer 114 as a mask to the anti-reflection layer 113, the spin-on-carbon layer 112 and the SiN hard mask and is stopped on the SiO2 insulating layer 102. Then, the spin-on-carbon layer 112 on the SiN hard mask 111 is removed by a dry stripping process to expose the SiN hard mask 111 completely.

After that, as shown in FIG. 1K, the SiN hard mask 111 is used as a hard mask to etch the $SiO_2$ insulating layer 102 and the silicon substrate 101 to form the fin structures 115.

FIG. 1K is a desired result illustrating an extremely flat bottom surface of the line-end cuts after the formation of the fin structures. However, it is not so in the actual process. As shown in FIG. 1L-1M, when the line-end cutting process for the fin structures is performed, the etching rate of the SiN hard mask 111 and that of the spin-on-carbon layer 112 are different, resulting in non-flat etch front at the bottom of the line-end cuts. If the etching rate of the spin-on-carbon layer is faster, silicon protrusions 116 will be formed as shown in FIG. 1L. Such silicon protrusions 116 will become silicon cones 117 as shown in FIG. 1M after etching the silicon substrate to form the fin structures, which finally affects the device electrical performance.

FIGS. 1N to 1O are SEM images corresponding to the actual process steps as shown in FIG. 1L to 1M. FIG. 1N shows the structure after etching the SiN hard mask 111 in which the silicon protrusions 116 can be clearly find out. FIG. 1O illustrates the line-end cut structure when the mask layers on the remained SiN hard mask 111 are removed and the fin structures are formed, wherein the silicon cones 117 can be clearly find out.

From above, one defect of the conventional line-end cutting method for fins is the formation of silicon protrusions and silicon cones during etching which results in the decrease of device electrical performance; another defect is that, since the fins to be formed are protected by the SiN hard mask during etching the silicon substrate, the SiN hard mask should be thick enough to ensure the formation of the fins. However, a too thick SiN hard mask may cause the fins to be formed having a high aspect ratio, thereby affecting the filling ability of the silicon oxide of the shallow trench isolations. While if the thickness of the SiN hard mask is reduced, the etching selectivity to the SiN hard mask should be considered during the etching process for fin formation, which increases the complexity of the etching process for forming fins.

Furthermore, the above mentioned conventional line-end cutting method also affects the alignment in the lithography process for the line-end cuts. In the conventional method, the pattern of the SiN hard mask is formed firstly by etching and the step height of the pattern is determined by the thickness of the SiN hard mask. Since lithographic alignment becomes more difficult due to the fact that lithography alignment marks are cut into segments in the sidewall self-aligned double patterning technology, it is required to increase the step height of the alignment marks, that is, the thickness of the SiN hard mask, and this may also cause the above mentioned conflict.

SUMMARY OF THE INVENTION

Accordingly, at least one object of this invention is to provide a line-end cutting method for the fin structures of FinFETs which are formed by double patterning technology involving forming fin lines at first and then etching to remove the line ends required to be cut to overcome the defects of the conventional method, so as to ensure a flat bottom topography of the line-end cuts and increase the device performance.

To achieve the above purpose, the present invention provides a line-end cutting method for fin structures of FinFETs formed by double patterning technology comprising:

Step S01, providing a substrate of a semiconductor device and depositing multiple layers comprising a SiN layer on the substrate;

Step S02, etching the multiple layers on the SiN layer by using a sacrificial-core-patterning process to form sidewalls; using the side walls as a mask and etching the remaining multiple layers comprising the SiN layer to form SiN hard mask lines;

Step S03, etching the substrate by using the SiN hard mask lines as a mask to form fin structures having silicon trenches therebetween;

Step S04, coating a mask layer and photoresist on the fin structures and patterning the photoresist to form a line-end cut pattern in the photoresist;

Step S05, using the patterned photoresist in the step S04 as a mask and etching to remove the SiN hard mask lines and the substrate at regions need to be cut, so as to form line-end cuts having flat bottom surface;

Step S06, removing the coated mask layer in the step S04 to obtain the fin structures with line-end cuts.

Preferably, the step S05 further comprises balancing the etching rate of the multiple layers through regulating etching parameters so as to make the bottom of the line-end cuts flat.

Preferably, the step S04 comprises spin coating a carbon-contained planarized mask layer, an anti-reflection layer and photoresist successively; the SiN hard mask lines and the substrate are removed by dry etching in the step S05; the coated mask layer is removed by a dry stripping process in the step S06.

Preferably, the multiple layers comprises a first $SiO_2$ layer, a first SiN layer, a first amorphous carbon layer, a second SiN layer, a second amorphous carbon layer and a nitrogen-free anti-reflection layer deposited successively on the substrate from bottom to top.

Preferably, the step S02 comprises:

Step S021, depositing an organic anti-reflection layer on the nitrogen-free anti-reflection layer and coating photoresist on the organic anti-reflection layer; defining a sacrificial core pattern in the photoresist through exposure and development, so as to complete a lithography process for the sacrificial core pattern;

Step S022, etching the organic anti-reflection layer, the nitrogen-free anti-reflection layer and the second amorphous carbon layer by using the photoresist as a mask to form the sacrificial core pattern comprising the second amorphous carbon layer and the nitrogen-free anti-reflection layer on the top of the second amorphous carbon layer;

Step S023, depositing a second $SiO_2$ layer on the sacrificial core pattern;

Step S024, anisotropic etching the second $SiO_2$ layer to expose the nitrogen-free anti-reflection layer of the sacrificial core pattern to form $SiO_2$ sidewalls of the sacrificial core pattern;

Step S025, etching to remove the nitrogen-free anti-reflection layer of the sacrificial core pattern to expose the underlying second amorphous carbon layer;

Step S026, anisotropic etching the exposed second amorphous carbon layer while remaining the $SiO_2$ sidewalls;

Step S027, etching the second SiN layer, the first amorphous carbon layer and the first SiN layer by using the $SiO_2$ sidewalls as a mask to form hard mask lines consist of SiN at bottom and amorphous carbon on the SiN.

Preferably, the etching process in the step S022 is dry etching, the etching process in the step S025 is dry etching, the anisotropic etching process in the step S026 is anisotropic plasma dry etching, the etching process in the step S027 is anisotropic plasma dry etching.

Preferably, the step S02 comprises:

Step S021', depositing an organic anti-reflection layer on the nitrogen-free anti-reflection layer and coating photoresist on the organic anti-reflection layer; performing a lithography process for sacrificial core pattern through exposure and development;

Step S022', etching the organic anti-reflection layer, the nitrogen-free anti-reflection layer and part of the second amorphous carbon layer by using the photoresist as a mask to form the sacrificial core pattern comprising the second amorphous carbon layer and the nitrogen-free anti-reflection layer on the top of the second amorphous carbon layer;

Step S023', depositing a second $SiO_2$ layer on the sacrificial core pattern;

Step S024', anisotropic etching the second $SiO_2$ layer to expose the nitrogen-free anti-reflection layer of the sacrificial core pattern to form $SiO_2$ sidewalls of the sacrificial core pattern;

Step S025', etching to remove the nitrogen-free anti-reflection layer of the sacrificial core pattern to expose the underlying second amorphous carbon layer;

Step S026', anisotropic etching the exposed second amorphous carbon layer to form first hard mask lines consist of the SiO$_2$ sidewalls and the remaining second amorphous carbon layer;

Step S027', etching the second SiN layer, the first amorphous carbon layer and the first SiN layer by using the first hard mask lines as a mask to form second hard mask lines consist of SiN at bottom and amorphous carbon on the SiN.

Preferably, after the etching process in the step S022', ¼ to ½ of the thickness of the second amorphous carbon layer at two sides of the sacrificial core pattern is remained.

Preferably, the etching process in the step S022' is dry etching, the etching process in the step S025' is dry etching, the anisotropic etching process in the step S026' is anisotropic plasma dry etching, the etching process in the step S027' is anisotropic plasma dry etching.

Preferably, the step S02 comprises:

Step S021", depositing an organic anti-reflection layer on the nitrogen-free anti-reflection layer and coating photoresist on the organic anti-reflection layer; performing a lithography process for a sacrificial core pattern through exposure and development;

Step S022", etching the organic anti-reflection layer, the nitrogen-free anti-reflection layer and the second amorphous carbon layer by using the photoresist as a mask to form the sacrificial core pattern comprising the second amorphous carbon layer and the nitrogen-free anti-reflection layer on the top of the second amorphous carbon layer;

Step S023", depositing a second SiO$_2$ layer on the sacrificial core pattern;

Step S024", etching to remove the second SiO$_2$ layer on the sacrificial core pattern to expose the nitrogen-free anti-reflection layer while remaining the second SiO$_2$ layer at two sides of the sacrificial core pattern;

Step S025", etching to remove the nitrogen-free anti-reflection layer of the sacrificial core pattern;

Step S026", etching to remove the second SiO$_2$ layer;

Step S027", depositing a third SiO$_2$ layer on the sacrificial core pattern;

Step S028", anisotropic etching the third SiO$_2$ layer to expose the second amorphous carbon layer of the sacrificial core pattern, so as to form SiO$_2$ sidewalls of the sacrificial core pattern; then removing the second amorphous layer of the sacrificial core layer pattern;

Step S029", etching the second SiN layer, the first amorphous carbon layer and the first SiN layer by using the SiO$_2$ sidewalls as a mask to form hard mask lines consist of SiN at bottom and amorphous carbon on the SiN.

The line-end cutting method for fin structures of FinFETs formed by double patterning technology of the present invention firstly utilizes the SiN hard mask lines to form fin structures and then performs lithography and etching processes to form line-end cuts. Since the depth of the line-end cuts is large, there is enough time and space to regulate the etching recipe so as to balance the etching rate of multiple layers including the spin-on-carbon layer, the SiN layer, the SiO$_2$ layer and the silicon substrate, thereby forming the fin structures with line-end cuts having flatter bottom topography and preventing the formation of silicon protrusions or silicon cones during the etching process.

In addition, the present invention makes the lithography alignment easier for the line-end cuts, which reduces the complexity of the etching process for the fins. In other words, there is no need to consider the etching selectivity to the hard mask when etching to form the fins, therefore larger etching process window can be achieved. The present invention also benefits the SiO2 filing process of shallow trench isolations after the patterning process of the fin structures, which simplifies the whole process, reduces the process development cost and improves the device electrical performance.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Figure 1A:
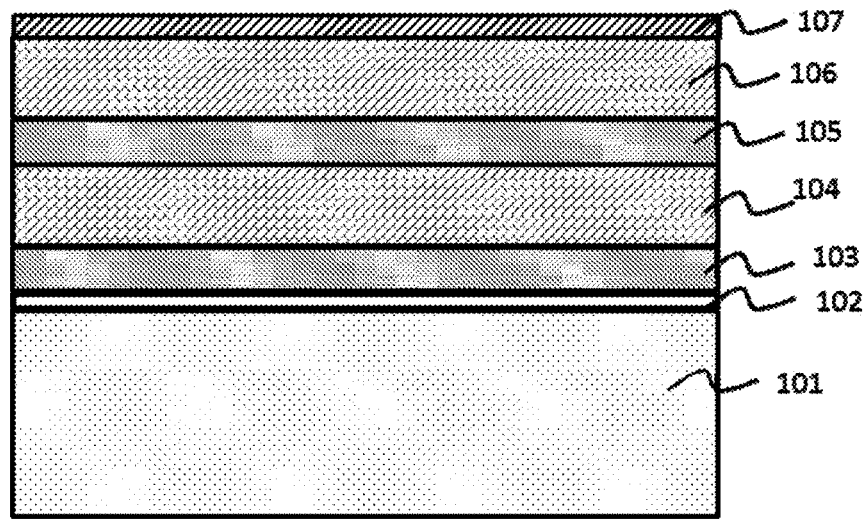
FIGS. 1A-1O are sectional views illustrating the steps of the conventional line-end cutting method for fin structures.
Figure 1B:
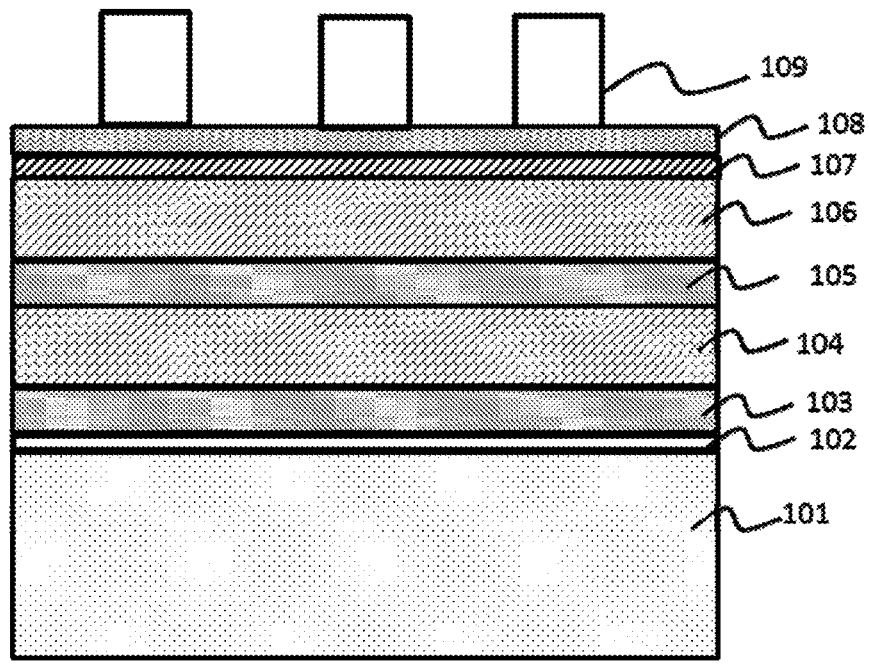
Figure 1C:
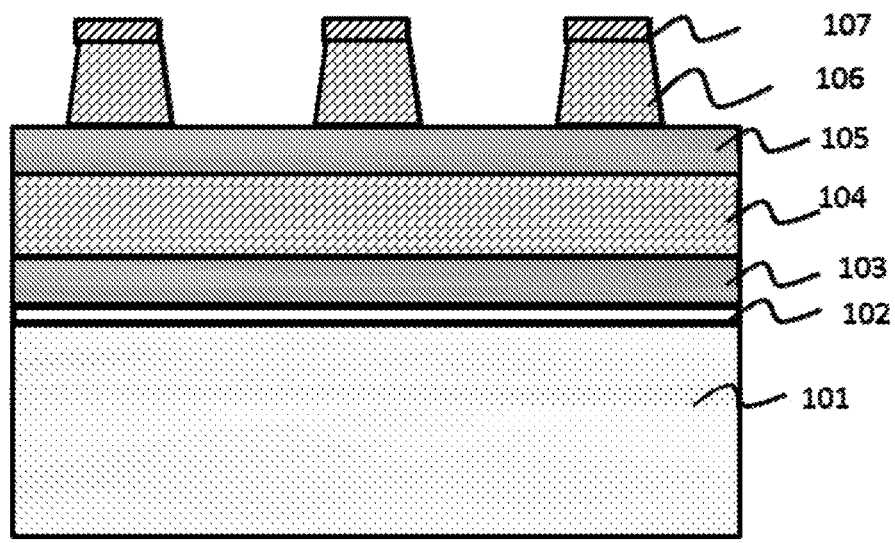
Figure 1D:
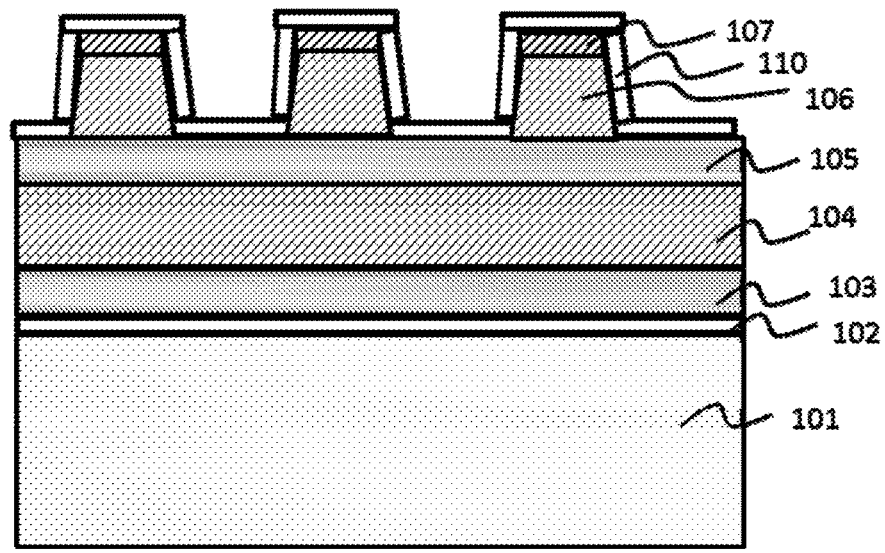
Figure 1E:
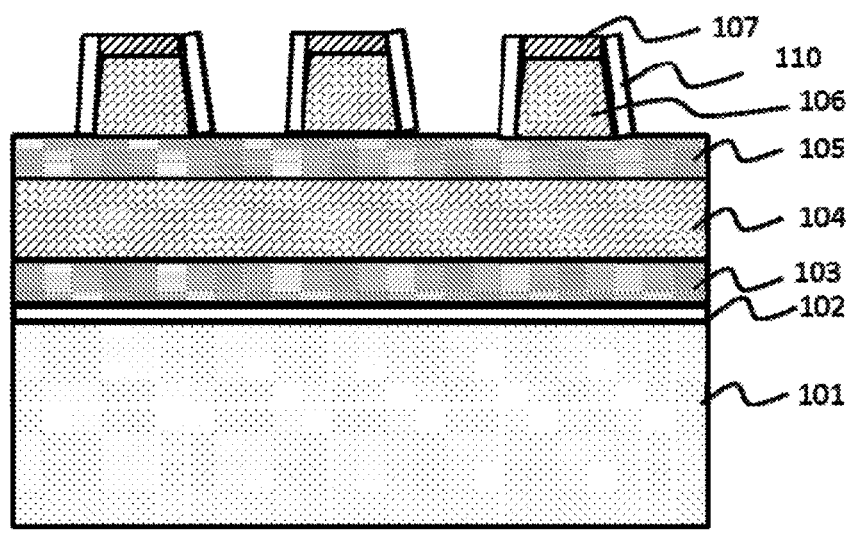
Figure 1F:
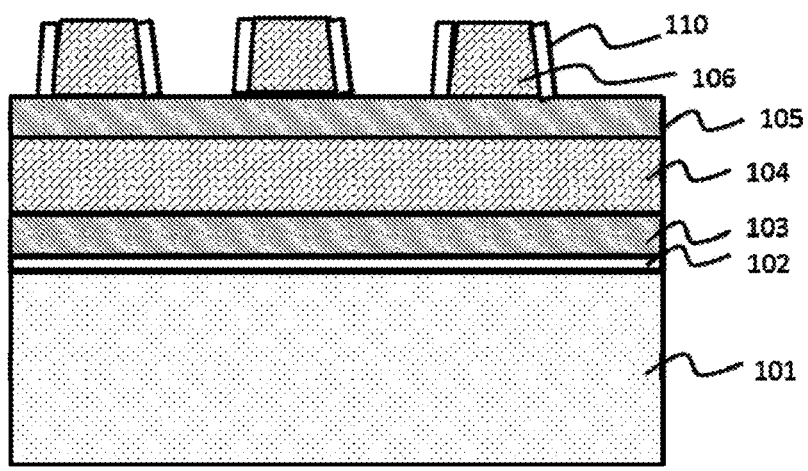
Figure 1G:
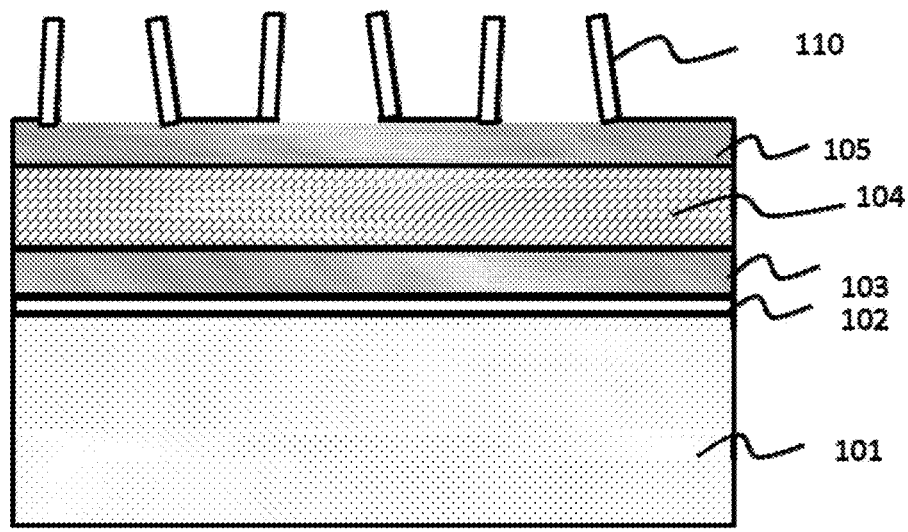
Figure 1H:
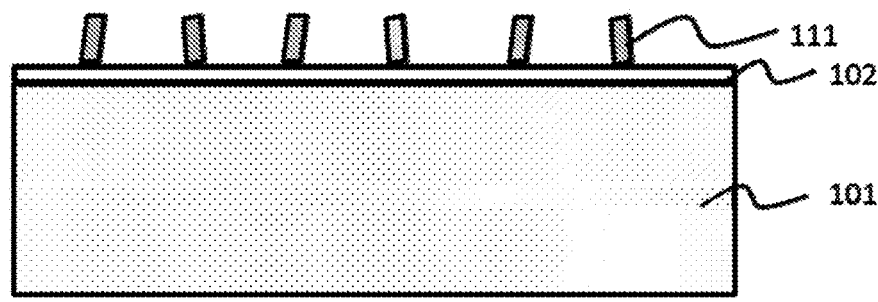
Figure 1I:
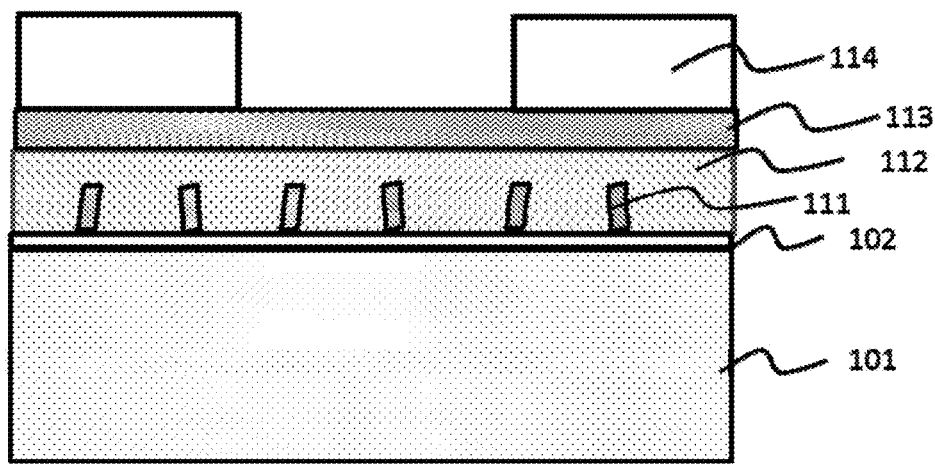
Figure 1J:
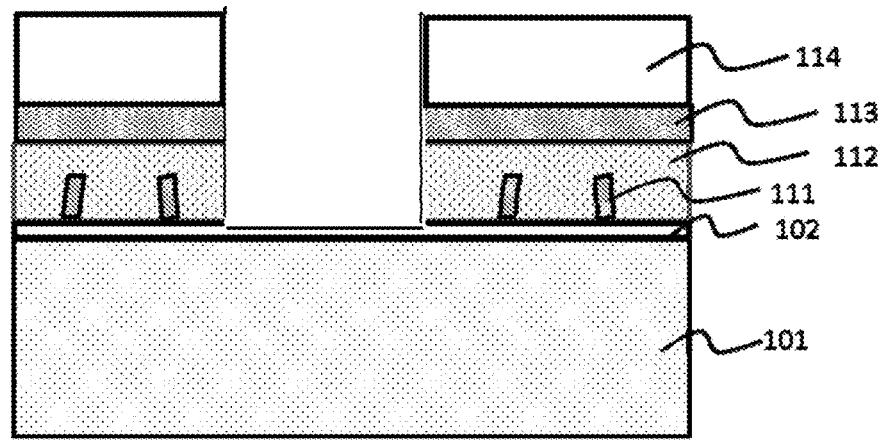
Figure 1K:
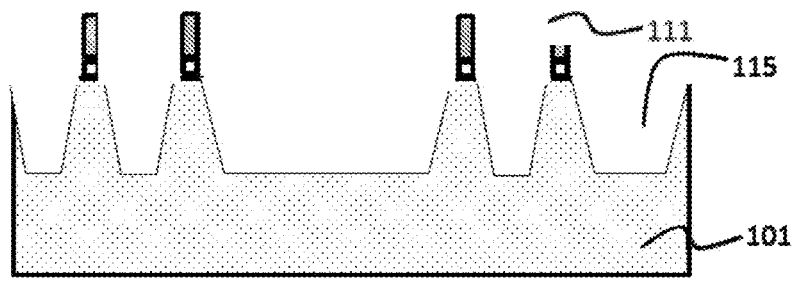
Figure 1L:
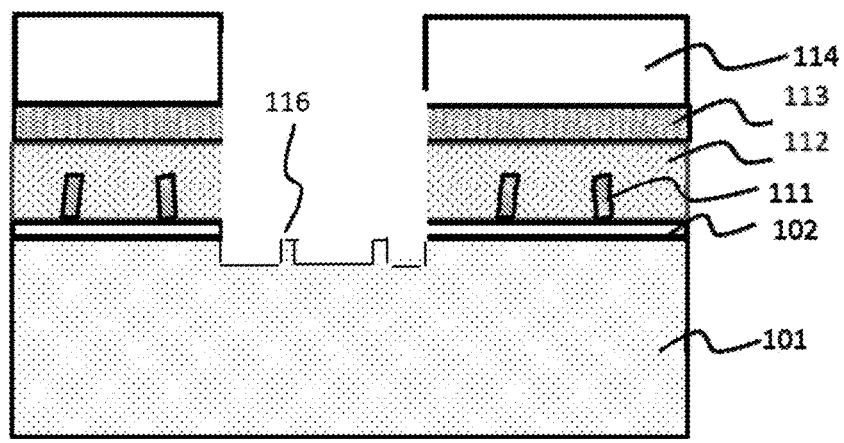
Figure 1M:
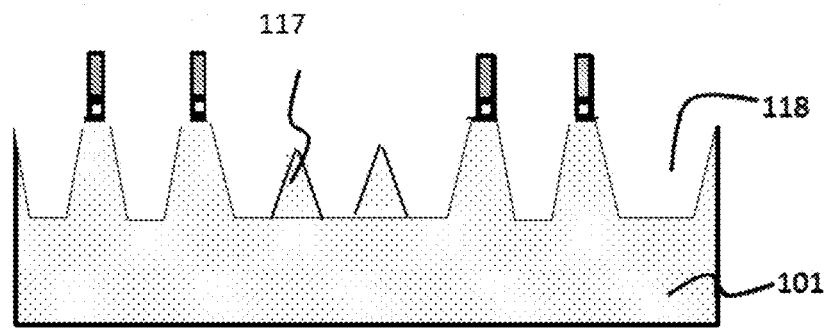
Figure 1N:
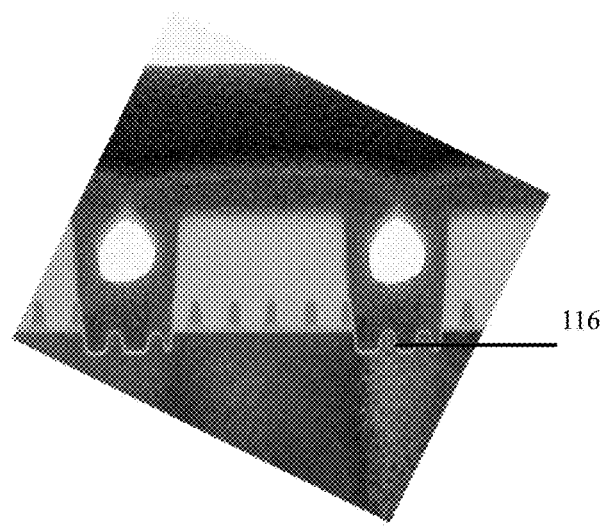
Figure 1O:
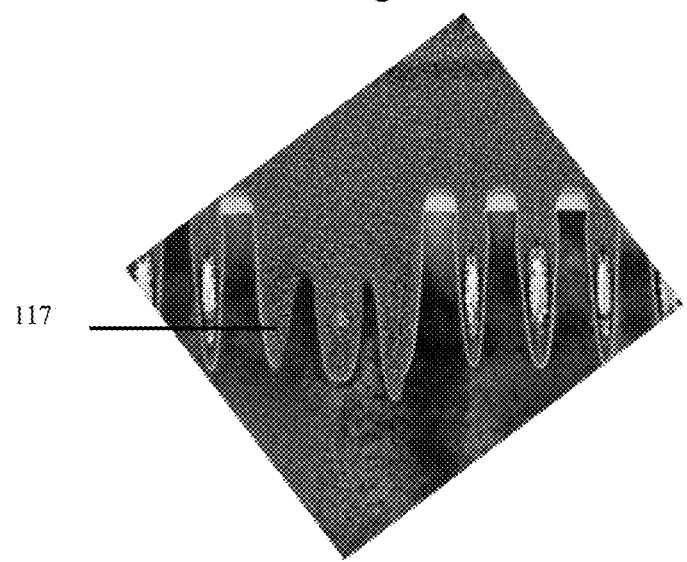
Figure 2:
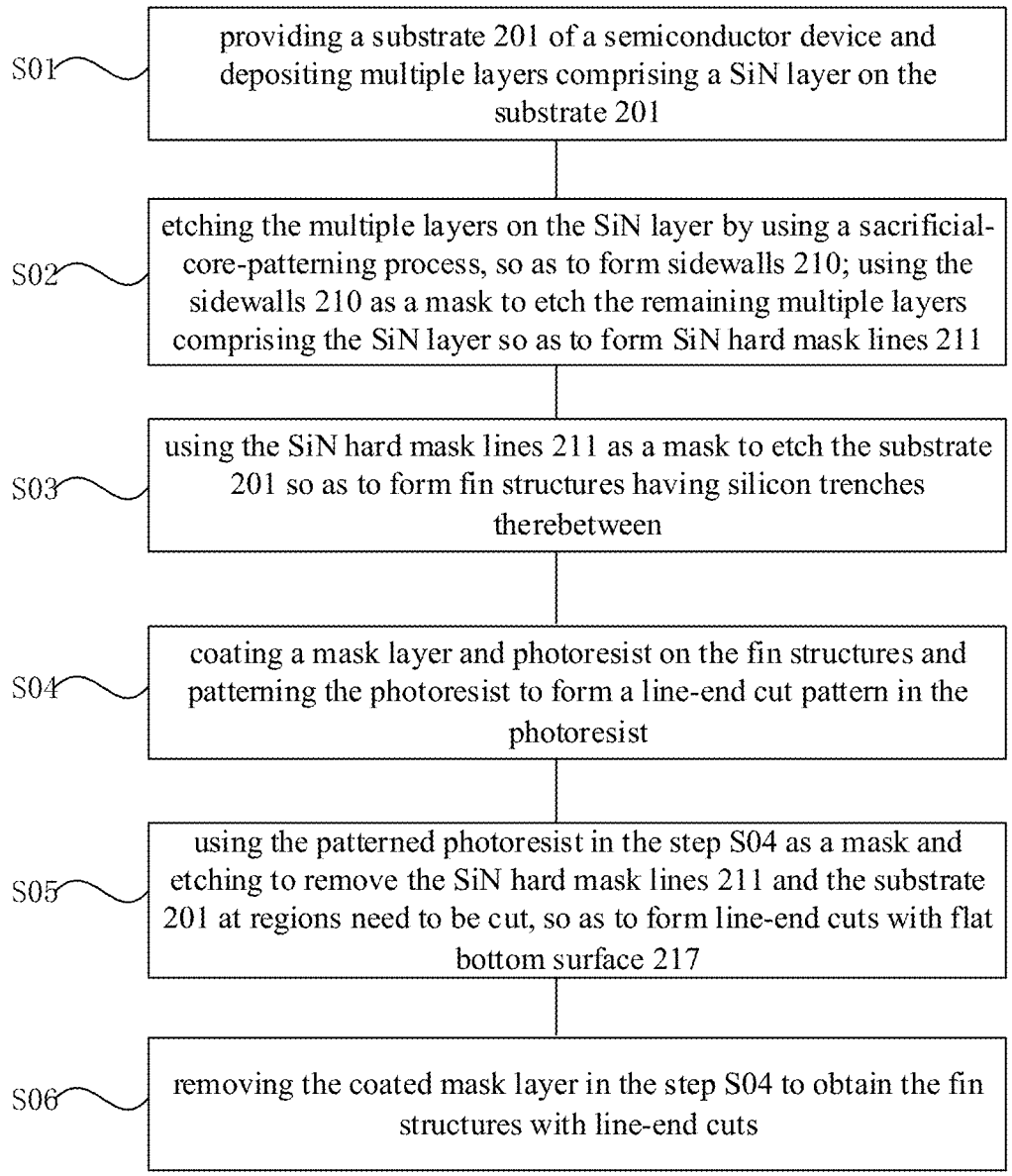
FIG. 2 is a flow chart of the line-end cutting method for fin structures of FinFETs formed by double patterning technology.
Figure 3A:
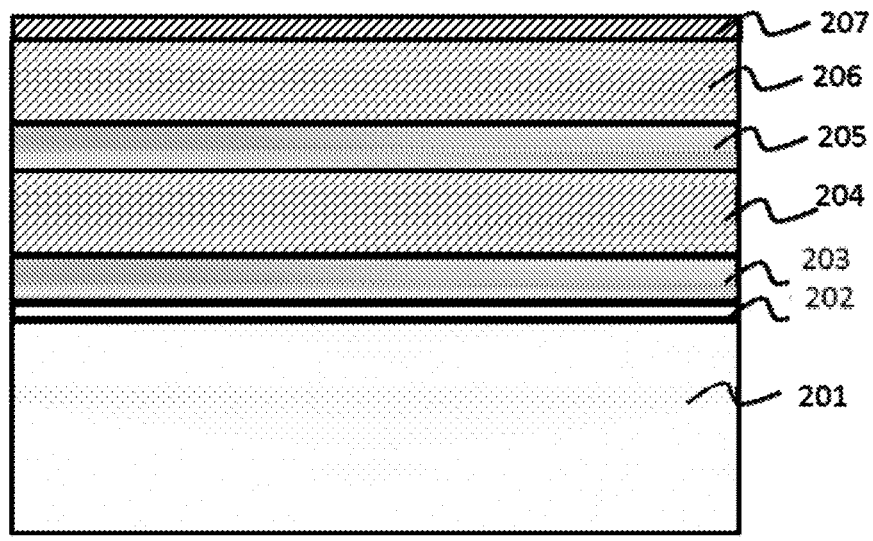
FIGS. 3A-3K are sectional views illustrating the steps of the line-end cutting method of the present invention.
Figure 3B:
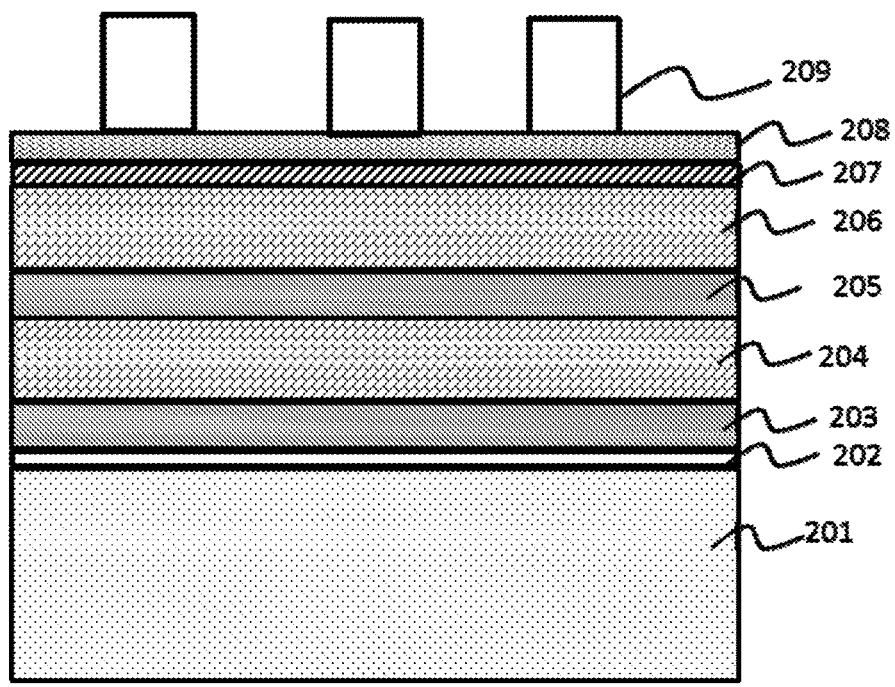
Figure 3C:
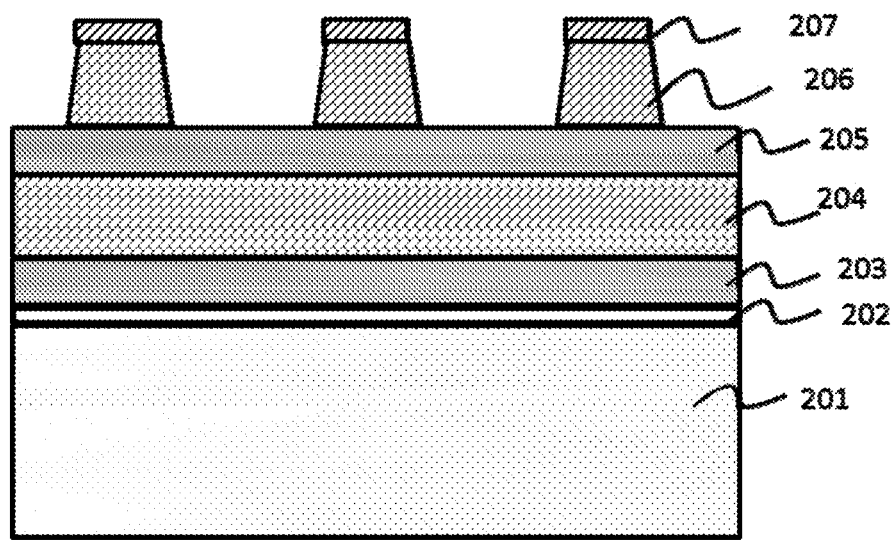
Figure 3D:
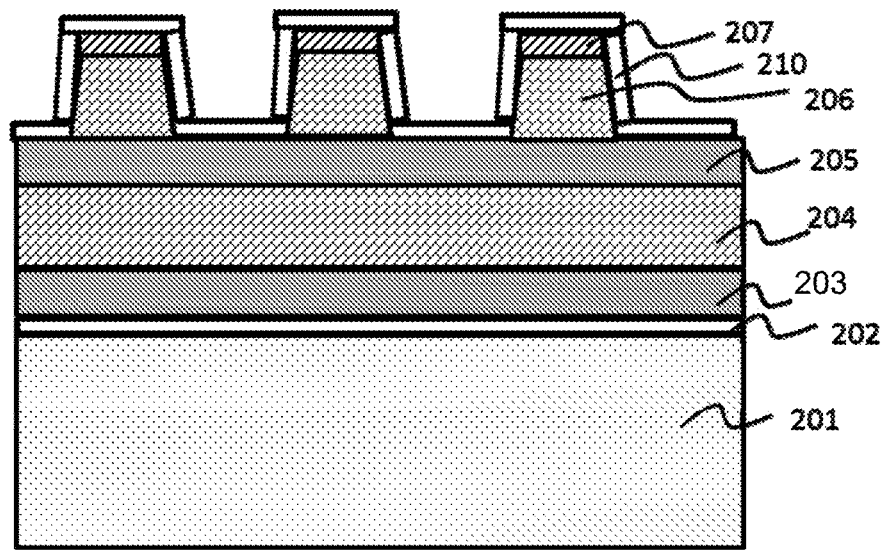
Figure 3E:
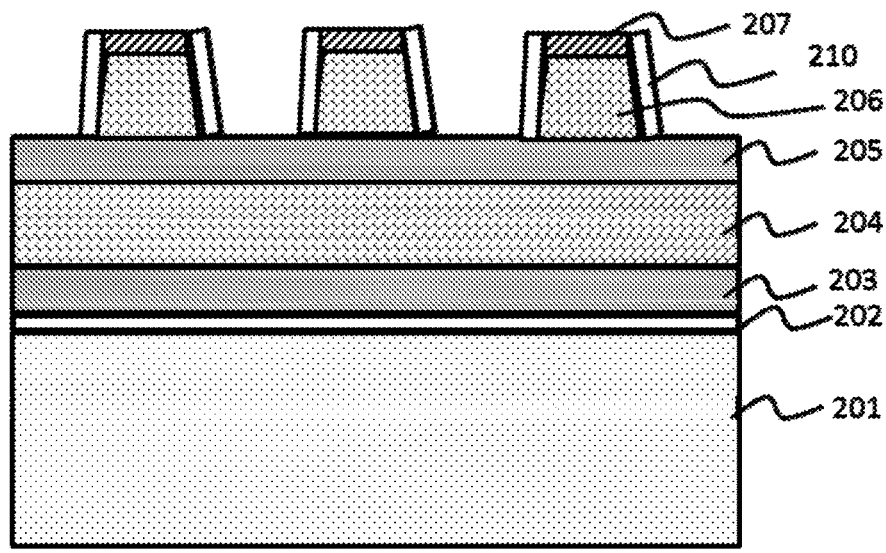
Figure 3F:
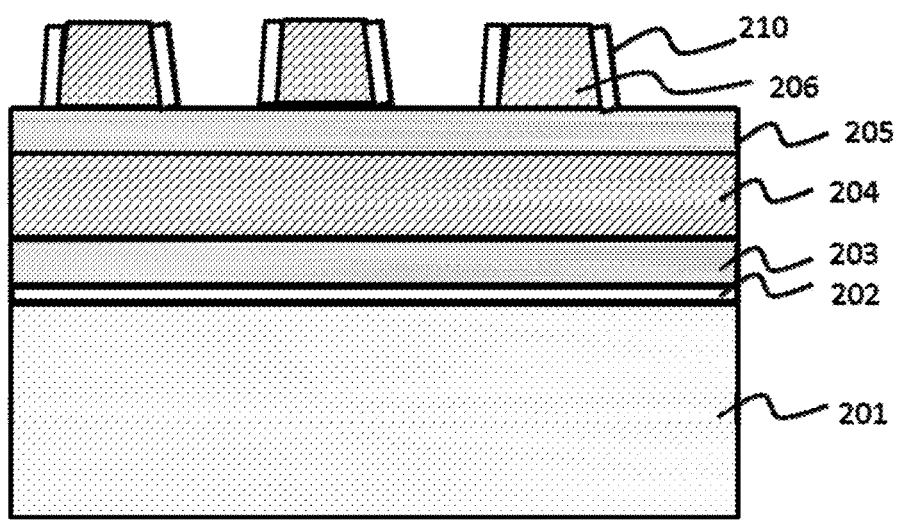
Figure 3G:
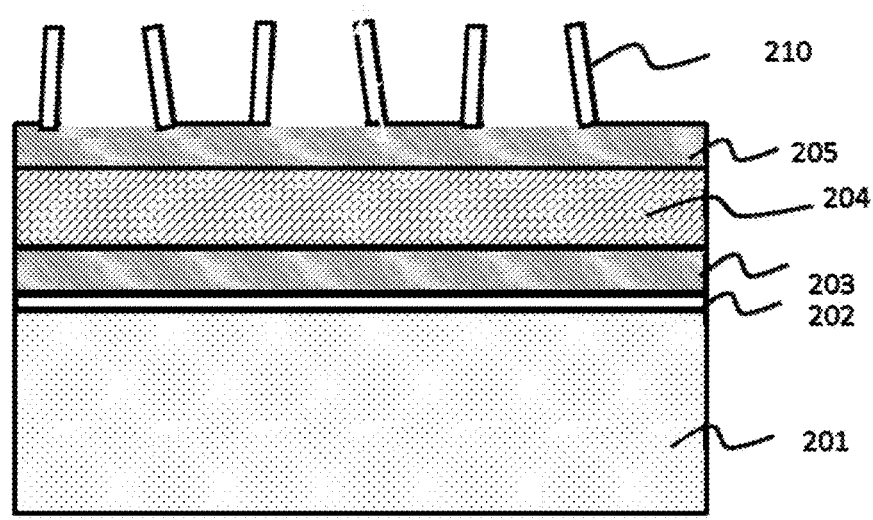
Figure 3H:
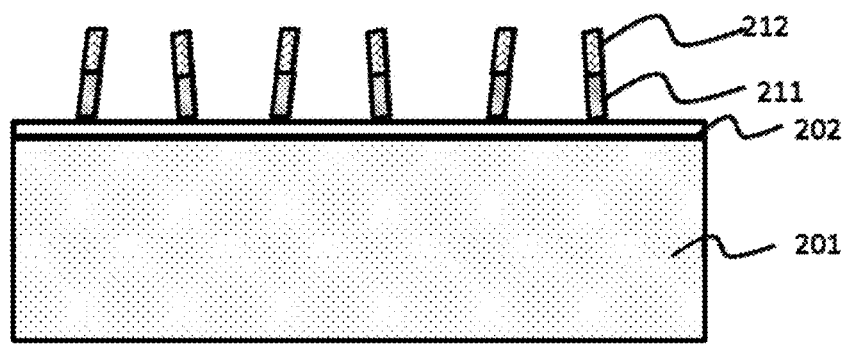
Figure 3I:
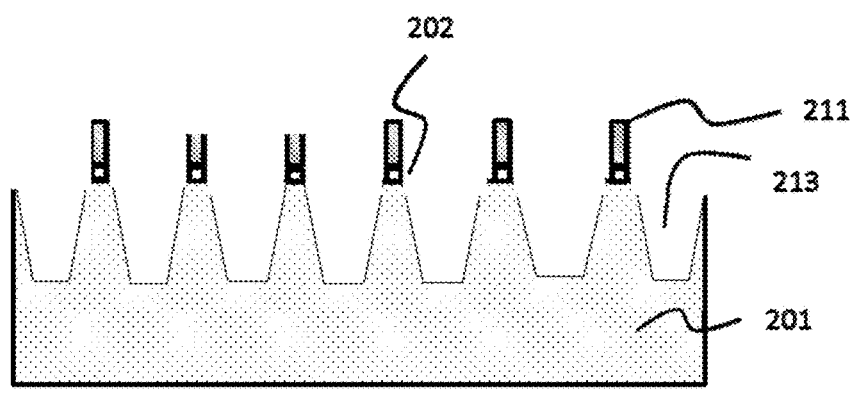
Figure 3J:
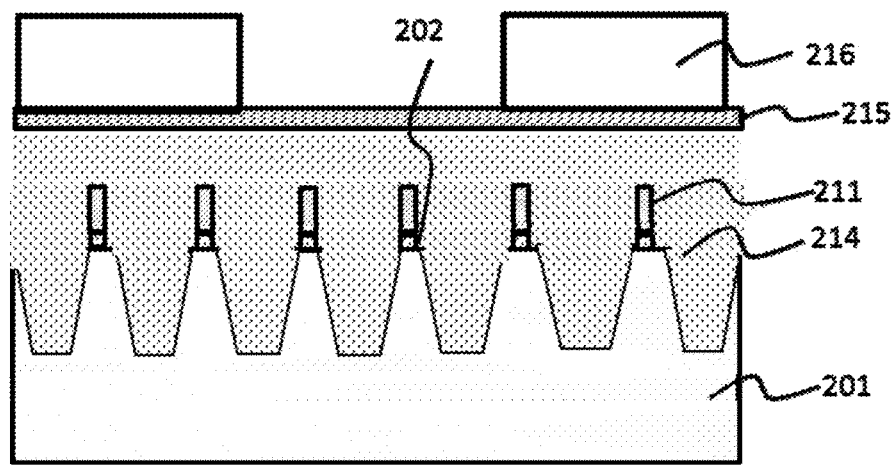
Figure 3K:
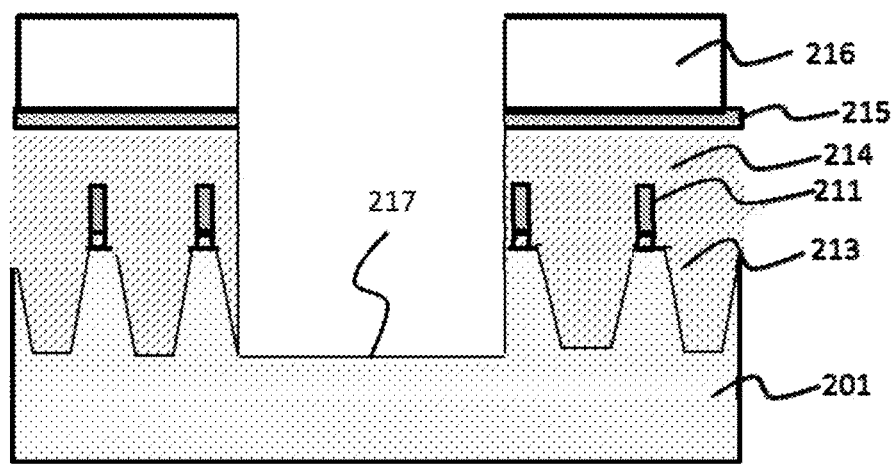

Please referring to FIG. 2 and FIGS. 3A-3K, the line-end cutting method for fin structures of FinFETs formed by double patterning technology of the present invention comprises the following steps:

Step S01, providing a substrate 201 of a semiconductor device and depositing multiple layers comprising a SiN layer on the substrate 201, as shown in FIG. 3A;

Step S02, etching the multiple layers on the SiN layer by using a sacrificial-core-patterning process, so as to form sidewalls 210; using the sidewalls 210 as a mask to etch the remaining multiple layers comprising the SiN layer so as to form SiN hard mask lines 211, as shown in FIGS. 3B-3H;

Step S03, using the SiN hard mask lines 211 as a mask to etch the substrate 201 so as to form fin structures having silicon trenches therebetween;

Step S04, coating a mask layer and photoresist on the fin structures and patterning the photoresist to form a line-end cut pattern in the photoresist, as shown in FIG. 3J;

Step S05, using the patterned photoresist in the step S04 as a mask and etching to remove the SiN hard mask lines 211 and the substrate 201 at regions need to be cut, so as to form line-end cuts with flat bottom surface 217, as shown in FIG. 3K;

Step S06, removing the coated mask layer in the step S04 to obtain the fin structures with line-end cuts.

Wherein, the step S05 further comprises balancing the etching rate of the multiple layers by regulating etching parameters so as to make the bottom of the line-end cuts flat. Since the mask layer and photoresist are coated on the already formed fin structures, the etching depth thereof is large, and thus the etching parameters such as etchants, etching rate and etching time for the multiple layers can be regulated at any time during etching to form a flat line-end cut bottom. As shown in FIG. 3J, when the photoresist 216 is patterned, the silicon-contained anti-reflection layer 215, the spin-on-carbon layer 214, the SiN hard mask lines 211 and the portion of the substrate 201 need to be cut are etched successively to form the structure as shown in FIG. 3K. Wherein, the multiple layers are made of common materials, the etching parameters are regulated according to the actual situation using conventional method in the prior art without creative work, which are omitted herein.

Wherein, the step S04 comprises spin coating a carbon-contained planarized mask layer, an anti-reflection layer and photoresist successively, that is, the spin-on-carbon layer 214, the silicon-contained anti-reflection layer 215 and the photoresist 216 in the embodiment. In the step S05, the SiN hard mask lines and the substrate are removed by conventional dry etching; in the step S06, the planarized mask layer, the anti-reflection layer and the photoresist are removed by conventional dry stripping.

Specifically, as shown in FIG. 3A, the multiple layers comprises a first SiO2 layer 202, a first SiN layer 203, a first amorphous carbon layer 204, a second SiN layer 205, a second amorphous carbon layer 206 and a nitrogen-free anti-reflection layer 207 deposited on the substrate 201 successively from bottom to top. The step S02 comprises the following steps:

Step S021, as shown in FIG. 3B, depositing an organic anti-reflection layer 208 on the top of the nitrogen-free anti-reflection layer 207, and then coating photoresist 209 on the organic anti-reflection layer 208; performing exposure and development to define a sacrificial core pattern in the photoresist 209 so as to complete the lithography process for the sacrificial core layer pattern.

Step S022, as shown in FIG. 3C, etching the organic anti-reflection layer 208, the nitrogen-free anti-reflection layer 207 and the second amorphous carbon layer 206 by using the photoresist 209 as a mask to form the sacrificial core pattern comprising the second amorphous carbon layer 206 and the nitrogen-free anti-reflection layer 207 on the top of the second amorphous carbon layer. Wherein, this step is performed by dry etching using conventional technical means and gas medium.

Step S023, as shown in FIG. 3D, depositing a second $SiO_2$ layer 210 on the sacrificial core pattern.

Step S024, as shown in FIG. 3E, anisotropic etching the second $SiO_2$ layer 210 to expose the nitrogen-free anti-reflection layer 207 of the sacrificial core layer pattern, so as to form $SiO_2$ sidewalls of the sacrificial core pattern.

Step S025, as shown in FIG. 3F, etching to remove the nitrogen-free anti-reflection layer 207 of the sacrificial core layer pattern to expose the underlying second amorphous carbon layer. Wherein, this step is performed by dry etching. Preferably, $CF_4$ or the mixture of $CF_4$ and Ar is used as etchant. Wherein, the gas flow of $CF_4$ is 50 sccm to 200 sccm, the gas flow of Ar is 50 sccm to 300 sccm, the RF power is 200 watt to 700 watt, the bias power is 50V to 400V, and the gas pressure is 3 mT to 12 mT.

Step S026, as shown in FIG. 3G, anisotropic etching the exposed second amorphous carbon layer 206 to form the $SiO_2$ sidewalls 210. Wherein, this step is performed by anisotropic plasma etching using conventional technical means.

Step S027, as shown in FIG. 3H, etching the second SiN layer 205, the first amorphous carbon layer 204 and the first SiN layer 203 by using the $SiO_2$ sidewalls 210 as a mask to form hard mask lines consist of SiN 211 at bottom and amorphous carbon 212 on the SiN 211. Wherein, this step is performed by anisotropic plasma etching using conventional technical means. Wherein, when this step is completed, the pitch of the hard mask lines is reduced by half.

Step S028, as shown in FIG. 3I, etching the first $SiO_2$ layer 202 and the silicon substrate 201 by using the hard mask lines consist of SiN 211 at bottom and amorphous carbon 212 on the SiN 211 as a mask to form fin structures having multiple silicon trenches 213 therebetween. Wherein, this step is performed by dry etching using conventional technical means.

In another embodiment, in order to avoid loss of the substrate at two sides of the sacrificial core pattern when removing the nitrogen-free anti-reflection layer in the step S025 and ensure the control of the profile and critical dimensions of the pattern to be transferred, a partial etching process can be performed in the step S022. The partial etching process involves etching the second amorphous carbon layer by a thickness of approximately ½ to ¾, depositing the $SiO_2$ layer and then etching to form the $SiO_2$ sidewalls, dry etching to remove the nitrogen-free anti-reflection layer of the sacrificial core pattern to expose the underlying second amorphous carbon layer, and finally using plasma etching to remove the exposed second amorphous carbon layer so as to form the hard mask lines consist of the $SiO_2$ sidewalls and the underlying amorphous carbon. Specifically, the step S02 comprises the following steps:

Step S021', depositing an organic anti-reflection layer on the nitrogen-free anti-reflection layer and coating photoresist on the organic anti-reflection layer; performing a lithography process for a sacrificial core pattern by exposure and development;

Step S022', etching the organic anti-reflection layer, the nitrogen-free anti-reflection layer and part of the second amorphous carbon layer by using the photoresist as a mask to form the sacrificial core pattern comprising the second amorphous carbon layer and the nitrogen-free anti-reflection layer on the top of the second amorphous carbon layer;

Step S023', depositing a second $SiO_2$ layer on the sacrificial core pattern;

Step S024', anisotropic etching the second $SiO_2$ layer to expose the nitrogen-free anti-reflection layer of the sacrificial core layer pattern to form the $SiO_2$ sidewalls of the sacrificial core pattern;

Step S025', etching to remove the nitrogen-free anti-reflection layer of the sacrificial core layer pattern;

Step S026', anisotropic etching the exposed second amorphous carbon layer to form first hard mask lines consist of the $SiO_2$ sidewalls and the underlying remaining second amorphous carbon layer;

Step S027', etching the second SiN layer, the first amorphous carbon layer and the first SiN layer by using the first hard mask lines as a mask to form second hard mask lines consist of SiN at bottom and amorphous carbon on the SiN.

Wherein, after the etching process in the step S022', ¼ to ½ of the thickness of the second amorphous carbon layer at the two sides of the sacrificial core layer pattern is remained.

Preferably, the etching process in the step S022' is dry etching, the etching process in the step S025' is dry etching, the anisotropic etching process in the step S026' is plasma dry etching, the etching process in the step S027' is anisotropic plasma dry etching By performing partial etching to the amorphous carbon layer, the remaining amorphous carbon layer will protect the underlying second SiN layer from plasma damage, which overcomes the problems of profile and critical dimension controlling and expands the subsequent patterning process window, thereby benefits the controlling for the critical dimension and profile of the fin structures and improves the device electrical performance.

In another embodiment, in order to avoid loss of the second SiN layer below the two sides of the sacrificial core pattern when removing the nitrogen-free anti-reflection layer in the step S025' and ensure the control of the profile and critical dimensions of the pattern to be transferred, a SiO$_2$ layer is deposited to protect the second SiN layer. Specifically, the step S02 comprises the following steps:

Step S021", depositing an organic anti-reflection layer on the top nitrogen-free anti-reflection layer and coating photoresist on the organic anti-reflection layer; performing a lithography process for a sacrificial core pattern by exposure and development;

Step S022", etching the organic anti-reflection layer, the nitrogen-free anti-reflection layer and the second amorphous carbon layer by using the photoresist as a mask to form the sacrificial core pattern comprising the second amorphous carbon layer and the nitrogen-free anti-reflection layer on the top of the amorphous carbon layer;

Step S023", depositing a second SiO$_2$ layer on the sacrificial core pattern;

Step S024", etching to remove the second SiO$_2$ layer on the top of the sacrificial core pattern to expose the nitrogen-free anti-reflection layer while remaining the second SiO$_2$ layer at two sides of the sacrificial core pattern;

Step S025", etching to remove the nitrogen-free anti-reflection layer of the sacrificial core pattern;

Step S026", etching to remove the second SiO$_2$ layer;

Step S027", depositing a third SiO$_2$ layer on the sacrificial core pattern;

Step S028", anisotropic etching the third SiO$_2$ layer to expose the second amorphous carbon layer of the sacrificial core pattern, so as to form SiO$_2$ sidewalls of the sacrificial core pattern; then removing the second amorphous layer of the sacrificial core pattern;

Step S029", etching the second SiN layer, the first amorphous carbon layer and the first SiN layer by using the SiO$_2$ sidewalls as a mask to form hard mask lines consist of SiN at bottom and amorphous carbon on the SiN.

By using the aforementioned method, and SiO$_2$ layer is deposited to protect the second SiN layer, so that the thickness of the second SiN layer will not be reduced when removing the nitrogen-free anti-reflection layer on the top of the second amorphous carbon layer, which overcomes the existing problems of profile and critical dimension controlling and expands the subsequent patterning process window, thereby benefits the controlling for the critical dimension and profile of the fin structures and improves the device electrical performance.

Wherein, the step S025" further comprises over etching to remove part of the second amorphous carbon layer underlying the nitrogen-free anti-reflection layer. By removing the damaged part of the second amorphous carbon layer due to the etching process, the height of the amorphous carbon layer is regulated and the top critical dimension of the second amorphous carbon layer is enlarged, which prevents the defects of a too small top critical dimension due to the lack of verticality of the second amorphous carbon layer and benefits pattern transfer.

Preferably, the etching process in the step S022" is dry etching, the etching process in the step S024" is plasma etching back, the etching process in the step S025" is dry etching, the etching process in the step S026" is wet etching, the etching process in the step S028" is anisotropic plasma dry etching and the second amorphous carbon layer of the sacrificial core pattern is removed by a stripping process, the etching process in the step S029" is anisotropic plasma dry etching.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A line-end cutting method for fin structures of FinFETs formed by double patterning technology comprising:

Step S01, providing a substrate of a semiconductor device and depositing multiple layers comprising a SiN layer on the substrate;

Step S02, etching the multiple layers on the SiN layer by using a sacrificial-core-patterning process to form sidewalls; using the side walls as a mask and etching the remaining multiple layers comprising the SiN layer to form SiN hard mask lines;

Step S03, etching the substrate by using the SiN hard mask lines as a mask to form fin structures having silicon trenches therebetween;

Step S04, coating a mask layer and photoresist on the fin structures and patterning the photoresist to form a line-end cut pattern in the photoresist;

Step S05, using the patterned photoresist in the step S04 as a mask and etching to remove the SiN hard mask lines and the substrate at regions need to be cut, so as to form line-end cuts having flat bottom surface;

Step S06, removing the coated mask layer in the step S04 to obtain the fin structures with line-end cuts;

wherein the multiple layers comprise a first SiO$_2$ layer, a first SiN layer, a first amorphous carbon layer, a second SiN layer, a second amorphous carbon layer and a nitrogen-free anti-reflection layer deposited successively on the substrate from bottom to top;

wherein the step S02 comprises:

Step S021, depositing an organic anti-reflection layer on the nitrogen-free anti-reflection layer and coating photoresist on the organic anti-reflection layer; defining a sacrificial core pattern in the photoresist through exposure and development, so as to complete a lithography process for the sacrificial core pattern;

Step S022, etching the organic anti-reflection layer, the nitrogen-free anti-reflection layer and the second amorphous carbon layer by using the photoresist as a mask to form the sacrificial core pattern comprising the second amorphous carbon layer and the nitrogen-free anti-reflection layer on the top of the second amorphous carbon layer;

Step S023, depositing a second SiO$_2$ layer on the sacrificial core pattern;

Step S024, anisotropic etching the second SiO$_2$ layer to expose the nitrogen-free anti-reflection layer of the sacrificial core pattern to form SiO$_2$ sidewalls of the sacrificial core pattern;

Step S025, etching to remove the nitrogen-free anti-reflection layer of the sacrificial core pattern to expose the underlying second amorphous carbon layer;

Step S026, anisotropic etching the exposed second amorphous carbon layer while remaining the SiO$_2$ sidewalls;

Step S027, etching the second SiN layer, the first amorphous carbon layer and the first SiN layer by using the SiO$_2$ sidewalls as a mask to form hard mask lines consist of SiN at bottom and amorphous carbon on the SiN.

2. The line-end cutting method according to claim 1, wherein the step S05 further comprises balancing the etching rate of the multiple layers through regulating etching parameters so as to make the bottom of the line-end cuts flat.

3. The line-end cutting method according to claim 1, wherein the step S04 comprises spin coating a carbon-contained planarized mask layer, an anti-reflection layer and photoresist successively; the SiN hard mask lines and the substrate are removed by dry etching in the step S05; the coated mask layer is removed by a dry stripping process in the step S06.

4. The line-end cutting method according to claim 1, wherein the etching process in the step S022 is dry etching, the etching process in the step S025 is dry etching, the anisotropic etching process in the step S026 is anisotropic plasma dry etching, the etching process in the step S027 is anisotropic plasma dry etching.

5. A line-end cutting method for fin structures of FinFETs formed by double patterning technology comprising:
Step S01, providing a substrate of a semiconductor device and depositing multiple layers comprising a SiN layer on the substrate;
Step S02, etching the multiple layers on the SiN layer by using a sacrificial-core-patterning process to form sidewalls; using the side walls as a mask and etching the remaining multiple layers comprising the SiN layer to form SiN hard mask lines;
Step S03, etching the substrate by using the SiN hard mask lines as a mask to form fin structures having silicon trenches therebetween;
Step S04, coating a mask layer and photoresist on the fin structures and patterning the photoresist to form a line-end cut pattern in the photoresist;
Step S05, using the patterned photoresist in the step S04 as a mask and etching to remove the SiN hard mask lines and the substrate at regions need to be cut, so as to form line-end cuts having flat bottom surface;
Step S06, removing the coated mask layer in the step S04 to obtain the fin structures with line-end cuts;
wherein the multiple layers comprise a first $SiO_2$ layer, a first SiN layer, a first amorphous carbon layer, a second SiN layer, a second amorphous carbon layer and a nitrogen-free anti-reflection layer deposited successively on the substrate from bottom to top;
wherein the step S02 comprises:
Step S021', depositing an organic anti-reflection layer on the nitrogen-free anti-reflection layer and coating photoresist on the organic anti-reflection layer; performing a lithography process for sacrificial core pattern through exposure and development;
Step S022', etching the organic anti-reflection layer, the nitrogen-free anti-reflection layer and part of the second amorphous carbon layer by using the photoresist as a mask to form the sacrificial core pattern comprising the second amorphous carbon layer and the nitrogen-free anti-reflection layer on the top of the second amorphous carbon layer;
Step S023', depositing a second $SiO_2$ layer on the sacrificial core pattern;
Step S024', anisotropic etching the second $SiO_2$ layer to expose the nitrogen-free anti-reflection layer of the sacrificial core pattern to form $SiO_2$ sidewalls of the sacrificial core pattern;
Step S025', etching to remove the nitrogen-free anti-reflection layer of the sacrificial core pattern to expose the underlying second amorphous carbon layer;
Step S026', anisotropic etching the exposed second amorphous carbon layer to form first hard mask lines consist of the $SiO_2$ sidewalls and the remaining second amorphous carbon layer;
Step S027', etching the second SiN layer, the first amorphous carbon layer and the first SiN layer by using the first hard mask lines as a mask to form second hard mask lines consist of SiN at bottom and amorphous carbon on the SiN.

6. The line-end cutting method according to claim 5, wherein the step S05 further comprises balancing the etching rate of the multiple layers through regulating etching parameters so as to make the bottom of the line-end cuts flat.

7. The line-end cutting method according to claim 5, wherein the step S04 comprises spin coating a carbon-contained planarized mask layer, an anti-reflection layer and photoresist successively; the SiN hard mask lines and the substrate are removed by dry etching in the step S05; the coated mask layer is removed by a dry stripping process in the step S06.

8. The line-end cutting method according to claim 5, wherein after the etching process in the step S022', ¼ to ½ the thickness of the second amorphous carbon layer at two sides of the sacrificial core pattern is remained.

9. The line-end cutting method according to claim 5, wherein the etching process in the step S022' is dry etching, the etching process in the step S025' is dry etching, the anisotropic etching process in the step S026' is anisotropic plasma dry etching, the etching process in the step S027' is anisotropic plasma dry etching.

10. A line-end cutting method for fin structures of FinFETs formed by double patterning technology comprising:
Step S01, providing a substrate of a semiconductor device and depositing multiple layers comprising a SiN layer on the substrate;
Step S02, etching the multiple layers on the SiN layer by using a sacrificial-core-patterning process to form sidewalls; using the side walls as a mask and etching the remaining multiple layers comprising the SiN layer to form SiN hard mask lines;
Step S03, etching the substrate by using the SiN hard mask lines as a mask to form fin structures having silicon trenches therebetween;
Step S04, coating a mask layer and photoresist on the fin structures and patterning the photoresist to form a line-end cut pattern in the photoresist;
Step S05, using the patterned photoresist in the step S04 as a mask and etching to remove the SiN hard mask lines and the substrate at regions need to be cut, so as to form line-end cuts having flat bottom surface;
Step S06, removing the coated mask layer in the step S04 to obtain the fin structures with line-end cuts;
wherein the multiple layers comprise a first $SiO_2$ layer, a first SiN layer, a first amorphous carbon layer, a second SiN layer, a second amorphous carbon layer and a nitrogen-free anti-reflection layer deposited successively on the substrate from bottom to top;
wherein the step S02 comprises:
Step S021", depositing an organic anti-reflection layer on the nitrogen-free anti-reflection layer and coating photoresist on the organic anti-reflection layer; performing a lithography process for a sacrificial core pattern through exposure and development;
Step S022", etching the organic anti-reflection layer, the nitrogen-free anti-reflection layer and the second amorphous carbon layer by using the photoresist as a mask to form the sacrificial core pattern comprising the second amorphous carbon layer and the nitrogen-free anti-reflection layer on the top of the second amorphous carbon layer;
Step S023", depositing a second $SiO_2$ layer on the sacrificial core pattern;

Step S024", etching to remove the second SiO$_2$ layer on the sacrificial core pattern to expose the nitrogen-free anti-reflection layer while remaining the second SiO$_2$ layer at two sides of the sacrificial core pattern;

Step S025", etching to remove the nitrogen-free anti-reflection layer of the sacrificial core pattern;

Step S026", etching to remove the second SiO$_2$ layer;

Step S027", depositing a third SiO$_2$ layer on the sacrificial core pattern;

Step S028", anisotropic etching the third SiO$_2$ layer to expose the second amorphous carbon layer of the sacrificial core pattern, so as to form SiO$_2$ sidewalls of the sacrificial core pattern; then removing the second amorphous layer of the sacrificial core layer pattern;

Step S029", etching the second SiN layer, the first amorphous carbon layer and the first SiN layer by using the SiO$_2$ sidewalls as a mask to form hard mask lines consist of SiN at bottom and amorphous carbon on the SiN.

11. The line-end cutting method according to claim 8, wherein the step S05 further comprises balancing the etching rate of the multiple layers through regulating etching parameters so as to make the bottom of the line-end cuts flat.

12. The line-end cutting method according to claim 8, wherein the step S04 comprises spin coating a carbon-contained planarized mask layer, an anti-reflection layer and photoresist successively; the SiN hard mask lines and the substrate are removed by dry etching in the step S05; the coated mask layer is removed by a dry stripping process in the step S06.

* * * * *